(12) United States Patent
Doppalapudi et al.

(10) Patent No.: US 6,275,137 B1
(45) Date of Patent: Aug. 14, 2001

(54) SEMICONDUCTOR PIEZORESISTOR

(75) Inventors: Dharanipal Doppalapudi, Somerville; Theodore D. Moustakas, Dover; Richard Mlcak, Cambridge; Harry L. Tuller, Wellesley, all of MA (US)

(73) Assignee: Boston MicroSystems, Inc., Woburn, MA (US)

( * ) Notice: Subject to any disclaimer, the term of this patent is extended or adjusted under 35 U.S.C. 154(b) by 0 days.

(21) Appl. No.: 09/500,408

(22) Filed: Feb. 8, 2000

(51) Int. Cl.$^7$ ....................................................... E10L 1/22
(52) U.S. Cl. .................. 338/2; 338/5; 257/417; 29/620; 29/621
(58) Field of Search .................... 338/2, 5, 47, 101; 257/417; 29/610.1, 620, 621

(56) References Cited

U.S. PATENT DOCUMENTS

| | | |
|---|---|---|
| 3,331,998 | 7/1967 | Zuleeg . |
| 3,622,712 * | 11/1971 | Moore et al. ........................ 257/417 |
| 3,624,465 * | 11/1971 | Moore ................................. 257/417 |
| 4,141,025 * | 2/1979 | Bronshtein et al. ................. 257/417 |
| 4,422,063 * | 12/1983 | Pryor .................................... 338/2 |
| 4,785,275 * | 11/1988 | Adamitzki ............................ 338/5 |
| 4,839,708 * | 6/1989 | Kano et al. ........................... 338/2 |
| 5,338,416 | 8/1994 | Mlcak et al. ..................... 204/129.3 |
| 5,464,509 | 11/1995 | Mlcak et al. ..................... 204/129.3 |
| 6,060,336 * | 5/2000 | Wan ................................... 257/417 |

OTHER PUBLICATIONS

Foresi, J.S. and Moustakas, T.D., "Piezoresistance and Quantum Confinement in Microcrystalline Silicon," Mat. Res. Soc. Symp. Proc., 256:77, 79, 81 (1992).

Shor, J.S., "Photoelectrochemical Conductivity Selective Etch Stops for SiC," Appl. Phys. Lett. 60(8):1001–1003 (1992).

Gaska, R., "Piezoresistive Effect In GaN–AlN–GaN Structures," Appl. Phys. Lett. 71(26)3817–3819 (1997).

Bykhovski, A.D., "Piezoresistive Effect in Wurtzite n–type GaN," Appl. Phys. Lett. 68:818–819 (1996).

Seto, John Y.W., "Piezoresistive Properties of Polycrystalline Silicon," J. App. Physics 47(11) :4780–4783 (1976).

Gregory, O.J., et al., "High Temperature Strain Gages Based on Reactively Sputtered AlN$_x$ Thin Films," Surface and Coatings Technology, 88:79–89 (1996).

Leclercq, J.L., et al., "III–V Micromachined Devices for Microsystems," Microelectronics Journal 29(9) :613–619 (1998).

U.S. Patent Application entitled "Micromechanical Device" by Harry L. Tuller et al. filed Feb. 8, 2000, docket No. 2777 1000–000 (copy not included) Ser. #091500407.

\* cited by examiner

Primary Examiner—Karl D. Easthom
(74) Attorney, Agent, or Firm—Hamilton, Brook, Smith & Reynolds, PC

(57) ABSTRACT

A piezoresistor having a base substrate with a quantum well structure formed on the base substrate. The quantum well structure includes at least one quantum well layer bounded by barrier layers. The barrier layers are formed from a material having a larger bandgap than the at least one quantum well layer.

30 Claims, 3 Drawing Sheets

SEMICONDUCTOR PIEZORESISTOR

BACKGROUND OF THE INVENTION

Strain gages are commonly used to detect stresses in materials, changes in pressure and temperature, etc. Typically, strain gages employ one or more piezoresistive elements or piezoresistors which experience a change in resistance when subjected to strain induced by physical and/or chemical stimuli. The piezoresistive elements found in a conventional strain gage are usually formed of several loops of fine wire or a special foil composition. In use, the gage is bonded to the surface of the object to be analyzed. When the object is deformed in response to particular stimuli, the piezoresistive elements of the gage are strained which alters the resistance of the piezoresistive elements. The change in resistance is measured and then is correlated to the level of strain experienced by the object.

Recently, micro-electromechanical sensors have been developed that are manufactured by semiconductor microelectronic processing and precision etching technologies. These sensors can be employed for measuring parameters such as pressure, acoustic vibrations, inertia (acceleration, vibration, shock), gas concentration, temperature etc. Such sensors typically employ micromechanical elements (membranes, cantilever beams, microbridges, tethered proof masses, etc.) which are perturbed by physical and/or chemical stimuli, with the magnitude of the perturbation being related to the magnitude of the physical or chemical stimuli. Typically, piezoresistors are positioned on the micromechanical element at high-stress locations of the micromechanical element (for example, at the edge of a membrane). The sensitivity of such sensors is proportional to the piezoresistive gage factor of the piezoresistors, defined as: $GF=\Delta R/R\epsilon$, the relative change in resistance $\Delta R/R$ with strain $\epsilon$.

Silicon is a common material for forming the piezoresistors in micro-electromechanical sensors and has a gage factor that is suitable for various applications. However, in some instances, a higher gage factor is desirable so that the sensitivity of the sensor incorporating the piezoresistor can be increased, or alternatively, the micromechanical element on which the piezoresistor is positioned, can be stiffened for increased mechanical strength without reducing the sensitivity of the sensor. Attempts have been made to produce piezoresistors with higher gage factors than silicon, however, such attempts have not produced significantly higher gage factors with consistant piezoresistive properties.

SUMMARY OF THE INVENTION

The present invention is directed to a piezoresistor having a gage factor that is significantly higher than current piezoresistive devices. The piezoresistor of the present invention includes a base substrate with a quantum well structure formed on the base substrate. The quantum well structure has at least one quantum well layer bound or sandwiched by barrier layers. The barrier layers are formed from a material having a larger bandgap than the at least one quantum well layer.

In preferred embodiments, each quantum well layer in the quantum well structure is less than about 1000 Å thick and is more preferably about 5 Å to 30 Å thick. The barrier layers in the quantum well structure are less than about 1000 Å thick and are more preferably about 5 Å to 50 Å thick. The quantum well structure may have one or more quantum well layers with about 5 to 10 layers being preferred. Selected layers in the quantum well structure may be doped. The base substrate is preferably a single crystal and the layers of the quantum well structure are formed by epitaxial growth.

In one embodiment, the base substrate is a wafer, thin film or thin foil. In another embodiment, the base substrate is a micromachined mechanical element of a sensor on which the quantum well structure is fabricated.

The present invention piezoresistor can be fabricated from semiconductor materials which are resistant to harsh conditions, such as, high temperatures, high pressure, and corrosive or reactive gas environments. Such semiconductor materials are typically compatible with microelectronic devices and can be manufactured in batches. This makes the present invention piezoresistor low cost in comparison to metal strain gages. In addition, the piezoresistor can be fabricated either as a strain gage that is bonded to an object or structure to be analyzed, or as part of an electromechanical sensor for measuring parameters, such as, pressure, acceleration, vibration etc.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
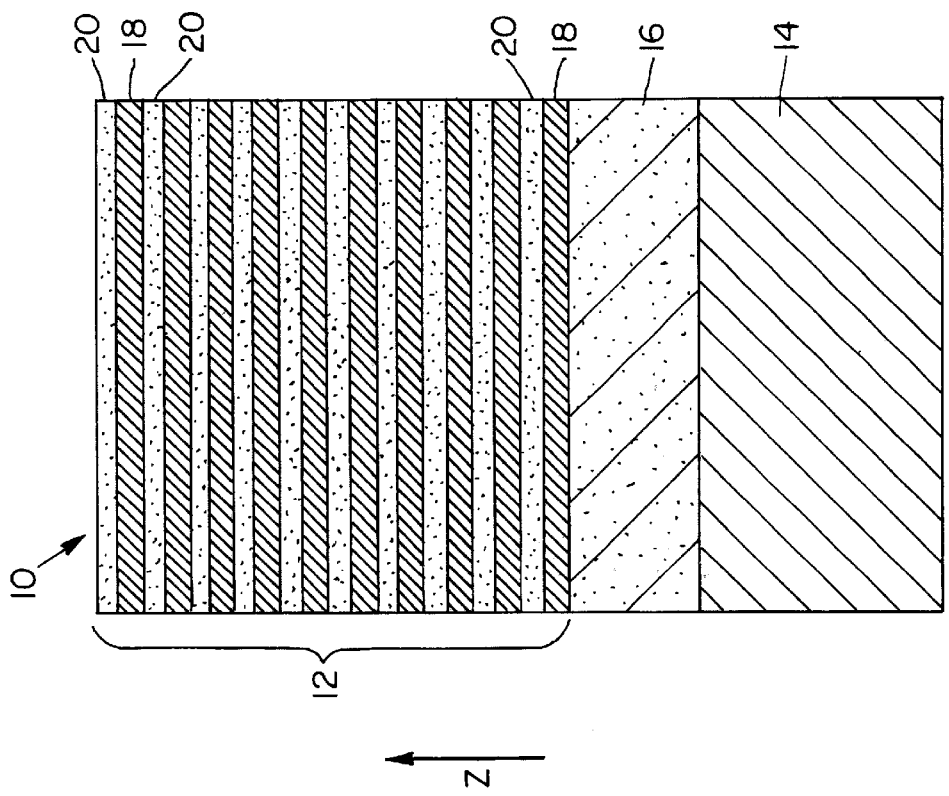
FIG. 1 is a schematic cross-sectional view of a preferred piezoresistor of the present invention.
Figure 5:
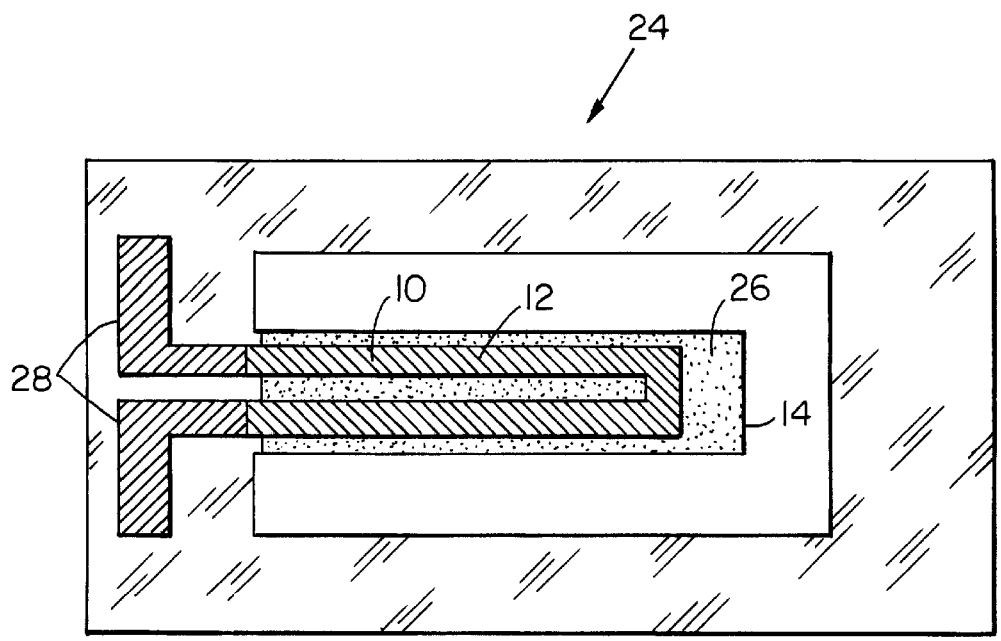
FIG. 5 is a plan view of a portion of an electromechanical sensor showing a multiple quantum well structure formed on a mechanical element of the sensor.

A description of a preferred embodiment of the invention follows. Referring to FIG. 1, piezoresistor 10 includes a single crystal base substrate 14, a thin insulating layer 16 deposited on the base substrate 14, and a quantum well semiconductor structure 12 deposited over the insulating layer 16. Typically, base substrate 14 is a mechanical element 26 of an electromechanical sensor 24 (FIG.5), a thin bulk wafer or a thin film or foil. When base substrate 14 is a wafer, film or foil, base substrate 14 must be thin enough so that piezoresistor 10 can be bonded to an object and will deform with the object when the object is subjected to stress. Insulating layer 16 electrically isolates the quantum well structure 12 from base substrate 14. Quantum well structure 12 consists of thin film smaller bandgap quantum well semiconductor layers 18 and larger bandgap barrier layers 20. The barrier layers 20 may be a semiconductor or an insulator. Typically, each smaller band gap layer 18 is bounded or sandwiched between two larger bandgap layers 20 which achieves quantum confinement of carriers within the smaller bandgap layer 18. The bottom layer 18 may be on the insulating layer 16 as shown in FIG. 1, where the insulating layer 16 serves as a barrier layer. The quantum well layers 18 are preferably doped n-type but alternatively, may be doped p-type or undoped. In addition, the barrier layers 20 can be doped instead of the quantum well layers 18.

Figure 2:
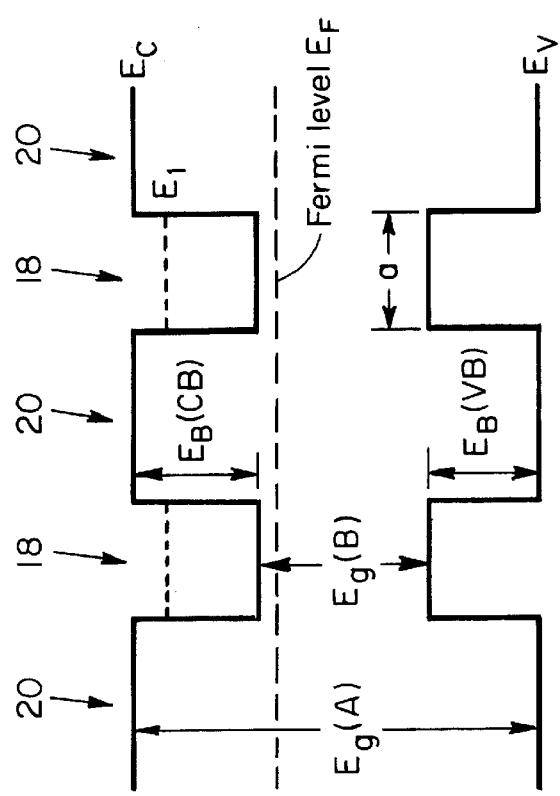
FIG. 2 is a band structure diagram for the quantum well structure of the piezoresistor of FIG. 1. Energy of the first quantized miniband $E_1$ changes with quantum well thickness a, which in turn depends on the stress applied. Also indicated are the bandgap energies $E_g$ (A), $E_g$ (B) and the barrier heights in the conduction and valence bands $E_B(CB)$, $E_B(VB)$, with A and B being the barrier and quantum well layers, respectively.
Figure 3:
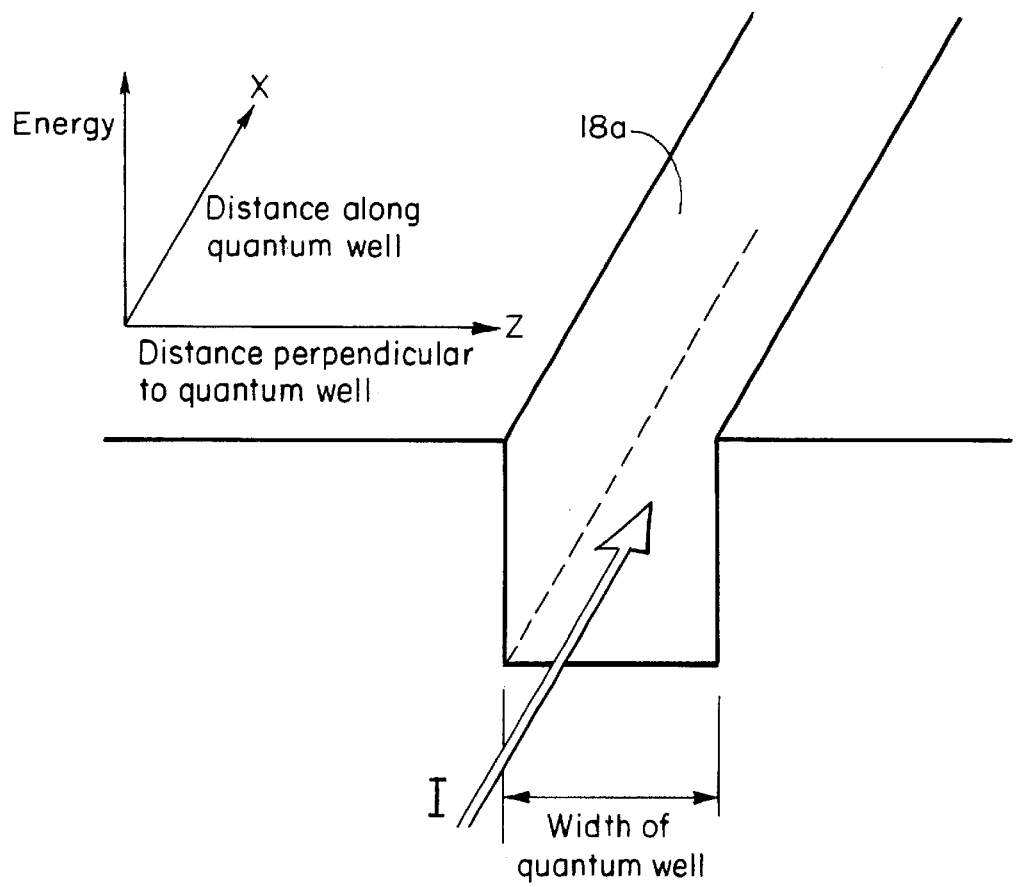
FIG. 3 is a schematic drawing of current I flowing through a quantum well.

Referring to FIG. 2, quantum confinement of carriers is achieved in the quantum well layers 18 with electrons at a first quantization miniband $E_1$. Miniband $E_1$ is shown in the conduction band of the quantum well, which corresponds to n-type doping. Alternatively, p-type doping would result in miniband $E_1$ being in the valence band. It is understood that more than one miniband $E_1, E_2, \ldots$ can exist in the quantum well. FIG. 3 depicts the manner in which current I flows in a quantum well layer 18. The barrier layers 20 have a barrier height $E_B(CB)$ that is higher than the first quantization miniband $E_1$. The miniband energy $E_1$ depends on the quantum well thickness as follows:

$$E_1 = \frac{h^2}{8m*a^2} \qquad (\text{Eq. 1})$$

where:
h is Planck's constant,
m* is the effective mass of the majority carrier in the quantum well layer 18, and
a is the thickness of the quantum well layer 18.

Quantum well structure 12 has a resistance, which is the parallel combination of the resistances of each individual quantum well layer 18. The lateral resistance R of an individual quantum well layer 18 depends on the number of carriers excited from the Fermi level to $E_1$ and thus depends on $E_1$ as follows:

$$R \propto e^{\frac{(E_1-E_F)}{kT}} \qquad (\text{Eq. 2})$$

where:
$E_F$ is the Fermi level
k is Boltzmann's constant; and
T is temperature.

The band structure and thus the carrier transport is highly sensitive to the stresses which modulate the quantum well thickness dimension a. For example, the application of a compressive stress reduces the quantum well dimension a, and in turn, increases $(E_1-E_F)$, thereby resulting in a large increase in resistance R due to the exponential dependence of R on $(E_1-E_F)$.

Substituting Eq. 1 for $E_1$ in Eq. 2 and assuming $E_F$ to be constant results in:

$$R = Ce^{\frac{h^2}{8m*a^2kT}} \qquad (\text{Eq. 3})$$

where:
C is a constant.

The relative change in resistance R at a particular temperature, can be found as a function of the quantum well dimension a by differentiating Eq. 3:

$$\frac{dR}{R} = \frac{-2h^2}{8m*kT} \frac{da}{a^3} \qquad (\text{Eq. 4})$$

where:
data is the strain ε in the quantum well structure 12.

The gage factor, defined as $(\Delta R/R\epsilon)$, is inversely proportional to $a^2$. High sensitivity is achieved with piezoresistors having large gage factors. Highest sensitivity is achieved by using very thin quantum well layers 18 as follows from the inverse $a^2$ dependence. Although FIG. 1 depicts multiple layers in the quantum well structure 12, a single quantum well layer is sufficient to realize the change in resistance as a result of strain in the film. However, large numbers (5 to 10) of quantum well layers are preferred to enable easier measurement. In FIG. 2, the band structure shows a Type I superlattice structure, where confinement of both electrons (in the conduction band) and holes (in the valence band) is possible. However, the electrons, having smaller effective mass m*, enable higher sensitivity. Carrier confinement can also be achieved using Type II superlattice structures, where only one type of carrier (electrons or holes) is confined to a layer and is active in electrical conduction.

Figure 4:
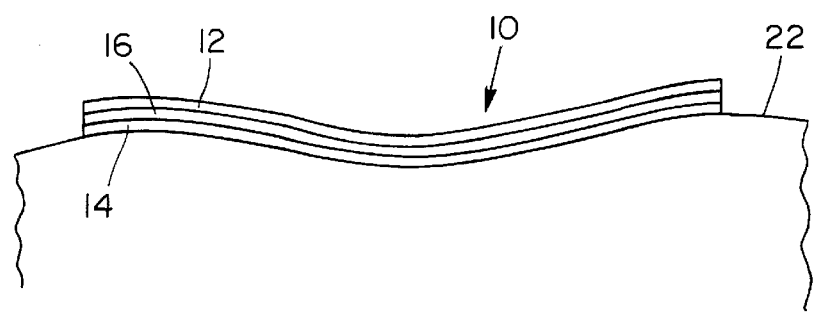
FIG. 4 is a schematic side view of a piezoresistor of the present invention bonded to the surface of a contoured object.

In use, when analyzing a structure or object, for example, an aircraft wing, engine components, etc., a piezoresistor 10 having a wafer, film or foil base substrate 14 is employed. The base substrate 14 is bonded to the structure of object 22 (FIG. 4). When the surface of the structure of object 22 has contours, a film or foil base substrate 14 is preferably employed because such a base substrate 14 allows piezoresistor 10 to conform to the contours. Once the structure or object 22 is subjected to stress, the piezoresistor 10 experiences strain. The strain changes the dimensions of the quantum well layer or layers 18, which thereby changes the resistance of the quantum well structure 12. The quantum well structure 12 is electrically connected to a measurement circuit. The change in resistance is measured by the measurement circuit, for example using a Wheatstone-bridge circuit. This change in resistance is then correlated to the strain of the underlying structure or object 22.

When base substrate 14 is a mechanical component or element of an electromechanical sensor 24, for example, a cantilevered beam 26 (FIG. 5), or a membrane, microbridge, tethered proof mass etc., the multiple quantum well structure 12 is formed on the mechanical element in a trace pattern with electrical contacts 28 on the two ends of the trace. The quantum well structure 12 is deposited on the mechanical element 26 in the desired pattern by employing standard masking techniques. By connecting the quantum well structure 12 to a measurement circuit, for example, a Wheatsonebridge circuit, the change in resistance of the quantum well structure 12 can be determined when the mechanical element 26 of the electromechanical sensor 24 is perturbed by external stimuli.

A more detailed description of piezoresistor 10 now follows. Base substrate 14 is preferably a single crystal because a single crystal provides a high quality surface that ensures that the overlying layers 16/18/20 will be of uniform thickness and have a high degree of crystalline perfection. Typical materials for base substrate 14 are silicon (Si), gallium arsenide (GaAs), silicon carbide (SiC) or sapphire, however, other suitable single crystal materials or amorphous or polycrystalline materials can be employed.

Insulating layer 16 is preferably about 1000 Å to 10,000 Å thick with about 5000 Å being preferred. A preferred material for insulating layer 16 is aluminum nitride (AlN).

Alternatively, other suitable resistive materials can be employed. However, when base substrate 14 is made of an insulating material, insulating layer 16 can be omitted.

The larger bandgap barrier layers 20 of quantum well structure 12 are preferably about 5 Å to 1000 Å thick with about 50 Å being preferred. Typical materials for barrier layers 20 may be semiconductors such as aluminum gallium nitride ($Al_xGa_{1-x}N$), silicon germanium ($Si_xGe_{1-x}$), aluminum gallium arsenide ($Al_xGa_{1-x}As$) etc., or insulators such as $SiO_2$ or $Si_3N_4$. The typical semiconductor materials for barrier layers 20 may be formed out of group IV (Si, Ge), group IV-IV (SiC), group III-V and group II-VI. The smaller bandgap quantum well layers 18 of quantum well structure 12 are preferably about 5 Å to 1000 Å thick with about 5 Å to 30 Å being preferred. The gage factor of piezoresistor 10 increases as the thickness of the quantum well layers 18 decrease. As the thickness of the quantum well layers 18 goes below about 30 Å, the gage factor of piezoresistor 10 increases dramatically. Typical materials for quantum well layers 18 are semiconductors such as gallium nitride (GaN), gallium arsenide (GaAs), indium phosphide (InP), silicon germanium ($Si_xGe_{1-x}$), etc. The typical materials for quantum well layers 18 may be formed out of group IV (where the group IV element may be Si,Ge,$Si_xGe_{1-x}$,SiC), group III-V (Solid solutions of Al,Ga,In,N,P,As and Sb) and group II-VI (solid solutions of Zn,Cd, Hg,O,S,Se and Te). Each quantum well layer 18 is preferably sandwiched between two barrier layers 20 such that the top and bottom layers of the quantum well structure 12 are barrier layers 20. Alternatively the bottom barrier layer 20 may be omitted if an insulating layer 16 is employed. In such a case, the insulating layer 16 forms the bottom barrier layer. The barrier layers 20 may be different compositions.

Figure 6:
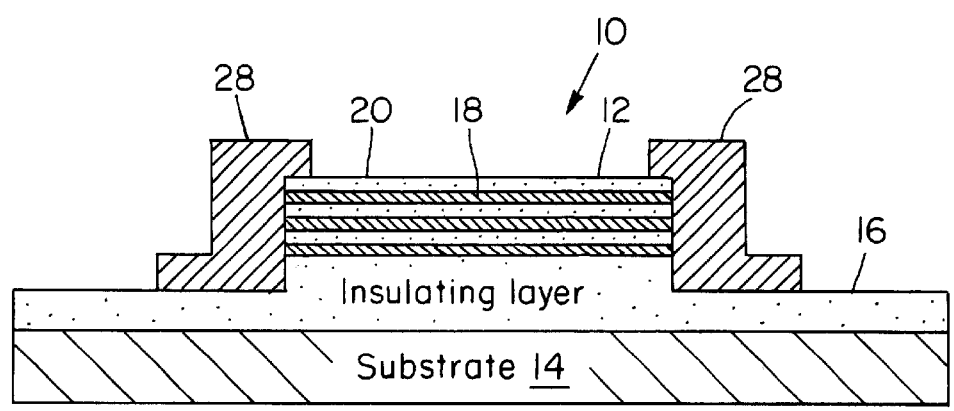
FIG. 6 is a schematic view of a preferred method for forming electrical contacts on a piezoresistor of the present invention. Ohmnic contacts are fabricated on the sidewalls, to measure lateral electrical transport along the quantum wells.

Typical methods of depositing layers 16, 18 and 20 over base substrate 14 are by physical vapor deposition (molecular beam epitaxy, sputtering, evaporation, etc.) or chemical vapor deposition. Such methods offer a very high degree of control for growth rate, background impurity levels and provide near atomic resolution which enables the formation of highly reproducible piezoresistors 10. The gage factor of piezoresistor 10 can be varied by varying the thickness of the layers 18/20, and varying the doping type and/or density. The highest gage factors can be achieved by depositing quantum well layers 18 being as thin as possible (about 5 Å to 10 Å). In addition, the bandgaps of the quantum well and barrier layers 18/20 can be tuned or varied by controlling the composition of the material in the layers 18/20. Electrical contacts 28 on quantum well structure 12 in one embodiment are fabricated by depositing suitable metals, for example by sputtering or e-beam evaporation, such that contact to all the layers of the quantum well structure 12 is made (FIG. 6).

An example of a preferred material combination for piezoresistor 10 is as follows: 6H-SiC or sapphire for base substrate 14, AlN for insulating layer 16, $Al_xGa_{1-x}N$ for barrier layers 20 and GaN for quantum well layers 18. Nitride semiconductor materials are preferred for piezoresistor 10 due to stability at high temperatures (1200°) and in corrosive or reactive gas environments. Less expensive materials such as column IV and lower gap III-V semiconductors, for example, Si, SiGe, $Al_xGa_{1-x}As$, InP and GaAs can be employed for use at lower temperatures or less corrosive or reactive gas environments. Another example is alternating layers of amorphous $SiO_2$ (barrier) and polycrystalline silicon (quantum well) deposited on a glass substrate. Alternatively, less costly semiconductor materials can be encapsulated by more costly high stability materials such as nitride semiconductor materials to reduce cost while improving the stability of the resulting piezoresistor 10.

Using semiconductor processing techniques, multiple piezoresistors 10 can be deposited on the same base substrate 14. Some of such piezoresistors 10 can be fabricated to have different gage factors. Using masking and/or etching techniques, different types of patterns can be formed on base substrate 14 such as a trace or comb structures.

While this invention has been particularly shown and described with references to preferred embodiments thereof, it will be understood by those skilled in the art that various changes in form and details may be made therein without departing from the scope of the invention encompassed by the appended claims.

For example, although a single crystal base substrate is preferred, alternatively, a portion of the base substrate may be single crystal with other portions being polycrystalline or amorphous. In such a case, a layer of single crystal material may be bonded to a polycrystalline or amorphous material. The quantum well structure is then formed on the single crystal layer.

What is claimed is:

1. A piezoresistor comprising:
   a base substrate; and
   a quantum well structure formed on the base substrate, the quantum well structure comprising at least one quantum well layer bounded by barrier layers, the barrier layers being formed from a material having a larger bandgap than the at least one quantum well layer, the at least one quantum well layer having a thickness of 30 Å or less.

2. The piezoresistor of claim 1 in which each quantum well layer is 5 Å to 30 Å thick.

3. The piezoresistor of claim 1 in which the barrier layers in the quantum well structure are more than 5 Å thick.

4. The piezoresistor of claim 1 in which the barrier layers are 5 Å to 50 Å thick.

5. The piezoresistor of claim 1 in which at least a portion of the base substrate is formed of a single crystal material.

6. The piezoresistor of claim 1 in which the quantum well structure has 5 to 10 quantum well layers.

7. The piezoresistor of claim 1 in which selected layers in the quantum well structure are doped.

8. The piezoresistor of claim 1 in which the layers of the quantum well structure are formed by epitaxial growth.

9. The piezoresistor of claim 1 in which the base substrate is a single crystal.

10. The piezoresistor of claim 1 in which the base substrate is a mechanical element of a sensor.

11. The piezoresistor of claim 10 in which the mechanical element is micromachined.

12. The piezoresistor of claim 1 in which the base substrate is a thin film.

13. The piezoresistor of claim 1 in which the at least one quantum well layer is formed from a material selected from the group consisting of group IV, group III-V and group II-VI semiconductor materials.

14. The piezoresistor of claim 1 in which the barrier layers are formed from an insulating material.

15. The piezoresistor of claim 1 in which the barrier layers are formed from a material selected from the group consisting of group IV, group III-V and group II-VI materials.

16. A piezoresistor comprising:
   a single crystal base substrate; and
   a quantum well structure formed on the base substrate, the quantum well structure having alternating semiconductor barrier and quantum well layers, the barrier layers being formed from a material having a larger bandgap than the quantum well layers, the quantum well layers having a thickness of 30 Å or less.

17. A piezoresistor comprising:
a base substrate, at least a portion of the base substrate being formed of a single crystal material; and
a quantum well structure formed on the single crystal portion of the base substrate, the quantum well Structure having alternating semiconductor barrier and quantum well layers, the barrier layers being formed from a material having a larger bandgap than the quantum well layers, the quantum well layers having a thickness of 30 Å or less.

18. A method of forming a piezoresistor comprising the steps of:
providing a base substrate; and
depositing at least one quantum well layer bounded by barrier layers on the base substrate to form a quantum well structure, the barrier layers being formed from a material having a larger bandgap than the at least one quantum well layer, the at least one quantum well layer having a thickness of 30 Å or less.

19. The method of claim 18 further comprising the step of forming each quantum well layer to a thickness of 5 Å to 30 Å.

20. The method of claim 18 further comprising the step of depositing barrier layers that are more than 5 Å thick.

21. The method of claim 19 further comprising the step of depositing barrier layers that are 5 Å to 50 Å thick.

22. The method of claim 18 further comprising the step of forming at least a portion of the base substrate from a single crystal material.

23. The method of claim 18 further comprising the step of depositing 5 to 10 quantum well layers in the quantum well structure.

24. The method of claim 18 in which the step of depositing the barrier and quantum well layers further comprises epitaxially growing the layers.

25. The method of claim 18 further comprising the step of doping selected layers in the quantum well structure.

26. The method of claim 18 further comprising the step of forming the base substrate from a single crystal.

27. The method of claim 18 further comprising the step of forming the base substrate from a mechanical element of a sensor.

28. The method of claim 27 further comprising the step of micromachining the mechanical element.

29. The method of claim 18 further comprising the step of forming the base substrate into a film.

30. A method of forming a piezoresistor comprising the steps of:
providing a single crystal base substrate; and
depositing alternating semiconductor barrier and quantum well layers on the base substrate to form a quantum well structure, the barrier layers being formed from a material having a larger bandgap than the quantum well layers, the quantum well layers having a thickness of 30 Å or less.

* * * * *